United States Patent [19]

Jeong et al.

[11] Patent Number: 5,401,678
[45] Date of Patent: Mar. 28, 1995

[54] TRANSISTOR AND METHOD FOR FABRICATING THE SAME

[75] Inventors: Jae G. Jeong; Youn J. Kim, both of Bubaleub, Rep. of Korea

[73] Assignee: Hyundai Electronics Industries Co., Ltd., Rep. of Korea

[21] Appl. No.: 162,631

[22] Filed: Dec. 2, 1993

[30] Foreign Application Priority Data

Dec. 2, 1992 [KR] Rep. of Korea ............... 1992-23084

[51] Int. Cl.⁶ ......................................... H01L 21/265
[52] U.S. Cl. ....................................... 437/44; 437/46; 437/909; 437/160; 257/344
[58] Field of Search ............... 437/44, 69, 909, 41, 437/37, 46, 160; 257/344

[56] References Cited

U.S. PATENT DOCUMENTS

| | | | |
|---|---|---|---|
| 5,026,657 | 6/1991 | Lee et al. | 437/47 |
| 5,073,510 | 12/1991 | Kwon et al. | 437/40 |
| 5,082,796 | 1/1992 | Ei-Diwany et al. | 437/44 |
| 5,196,357 | 3/1993 | Boardman et al. | 437/40 |

*Primary Examiner*—Olik Chaudhuri
*Assistant Examiner*—Richard A. Booth
*Attorney, Agent, or Firm*—Merchant, Gould, Smith, Edell, Welter & Schmidt

[57] ABSTRACT

An LDD transistor, preventive of the weakening of source/drain junction breakdown voltage and the increase of junction leakage current, and a method for the fabrication of the same. The LDD transistor is comprised of: a field oxide film formed on a predetermined portion of a semiconductor having a low density ion-implanted region therein, the field oxide film having a damaged portion; a gate electrode formed over the field oxide film; an insulating film formed over the gate electrode; a gate polyoxide film resulting from the oxidation of the side wall of the gate electrode; a spacer insulating film formed at the side wall provided by the gate polyoxide film and the insulating film atop the gate polyoxide film; a pad polysilicon film deposited over the insulating film, spacer oxide film, the low density ion-implanted region and the field oxide film; and a high density ion-implanted region formed below the pad polysilicon film, being confined within the low density ion-implanted region.

4 Claims, 6 Drawing Sheets

TRANSISTOR AND METHOD FOR FABRICATING THE SAME

BACKGROUND OF THE INVENTION

1. Field of the invention

The present invention relates, in general, to a lightly doped drain (hereinafter "LDD") transistor and a method for the fabrication of the same, and more particularly, to improvements in source/drain junction breakdown voltage and junction leakage current.

2. Description of the Prior Art

Generally, as a semiconductor device becomes highly integrated, the integration degree of chip is increased and the channel of the transistor becomes shorten. The reduction of channel length causes problems such as drain-induced barrier lowering (hereinafter "DIBL"), hot carrier effect and short channel effect.

In order to solve these problems, a transistor which has an LDD structure has been proposed.

Hereinafter, description for a conventional LDD transistor is to be given for the better understanding of the prior art with reference to a few figures, wherein reference numeral 1 designates a silicon substrate whereas reference numerals 2, 3, 4, 5, 6, 6', 7, 8, 20, 30, 40 and 50 designate a field oxide film, a gate electrode, gate polyoxide film, an LDD region (or low density ion-implanted region), an oxide film, spacer oxide film, a high density ion-implanted region, an interlayer insulating film, an operating region mask, a gate electrode mask, an N+/P+ source/drain ion-implanting mask and a contact mask, respectively.

Referring initially to FIG. 1, there is a plan view showing only important mask layers required to fabricate a conventional LDD MOSFET. As shown in FIG. 1, an operational region mask 20 is used to form an operational region on a semiconductor substrate in advance of forming a gate electrode on a field oxide film by use of a gate electrode 30. Thereafter, an N+/P+ source/drain ion-implanted mask 40 covering the operational region mask is utilized in order to form a high density N+/P+ source/drain ion-implanted region, followed by the formation of a contact mask 50 for a contact hole.

Referring now to FIGS. 2A through 2D, there are cross-sectional views illustrating the fabrication steps for the conventional LDD MOSFET, taken generally through section line A—A' of FIG. 1, respectively.

First, FIG. 2A shows a silicon substrate having a P-well (or an N-well) which is sectioned by the formation of a field oxide film 2 into device separation region and an operational region, a gate electrode 3 covered with a gate polyoxide film 4 which is atop a gate oxide film (not shown) formed over the field oxide film 2, an LDD region 5 formed in the operational region and a blanket oxide film 6 which covers the resulting structure including bird's beak effected by the field oxide films 2.

The blanket oxide film 6 is subsequently subjected to an anisotropic etch process to form a spacer oxide film 6' and high density N+ (or P+) type impurities are, as indicated by arrows, implanted to form a high density N+ (or P+) ion-implanted source/drain region 7, as shown in FIG. 2B.

Next, a back thermal treatment process is applied for diffusing the LDD region 5 and the high density ion-implanted source/drain region 7 in the silicon substrate 1, as shown in FIG. 2C.

In the meanwhile, the reference mark A of the FIG. 3C designates a disadvantageous portion. That is, when the anisotropic etch process is applied to the blanket oxide film 6 so as to form the spacer oxide film 6', the bird's beak of the field oxide film 2 is partially etched at the portion intersected by the field oxide film 2, the gate electrode 3 and the operational region so as to injure the edge portion of the LDD region 5 which is worse deteriorated by the great density difference between the substrate 1 and the high density ion-implanted region 7.

Finally, FIG. 2D illustrates the process of forming a contact hole. For this, an interlayer insulating film 8 is entirely formed over the structure of FIG. 2C and then, subjected to a patterning process using a photosensitive material as a contact mask. Following that, an etch process is applied to the blanket interlayer insulating film 8 atop the operational region.

The above conventional LDD gate MOSFET comes to have the bird's beak which is partially removed at the intersectional portion among the gate electrode, the field oxide film and the operational region when carrying out the anisotropic etch process, so that the low density N− (or P−) LDD region gets damaged at its edge portion. What is worse, the low density N− (or P−) LDD region suffers from more damage caused by the great density difference between the high density N+ (or P+) ion-implanted source/drain region and the semiconductor substrate.

Such phenomena effect problems such as the weakening of source/drain junction breakdown voltage and the increase of junction leakage current.

SUMMARY OF THE INVENTION

Therefore, an object of the present invention is to solve the aforementioned problems encountered in the prior arts and to provide a transistor prevent of the weakening of junction breakdown voltage and of the increase of junction leakage current and a method for fabricating the same.

In accordance with an aspect of the present invention, this object can be accomplished by the provision of a transistor comprising of: a field oxide film formed on a predetermined portion of a semiconductor having a low density ion-implanted region therein, the field oxide film having a damaged portion; a gate electrode formed over the field oxide film; an insulating film formed over the gate electrode; a gate polyoxide film resulting from the oxidation of the side wall of said gate electrode; a spacer insulating film formed at the side wall provided by the gate polyoxide film and the insulating film atop the gate polyoxide film; a pad polysilicon film deposited over said insulating film, spacer oxide film, the low density ion-implanted region and the field oxide film; and a high density ion-implanted region formed below the pad polysilicon film, being confined within the low density ion-implanted region.

In accordance with another aspect of the present invention, the above object can be accomplished by the provision of a method for fabricating a transistor wherein a semiconductor substrate is sectioned into an operational region and a device separation region by the formation of a field oxide with a bird's beak of predetermined size and has in said operational region a low density ion-implanted region which a high density ion-implanted region is confined within, so as not to contact the high density ion-implanted region for source/drain region with said semiconductor substrate, the improvement which comprises the steps of: forming a gate electrode on the field oxide film, the gate electrode being insulated by an insulating film formed thereon and a gate polyoxide film resulting from the oxidation of its side wall; forming a spacer insulating film at the side wall provided by the insulating film and said gate polyoxide film; depositing a polysilicon film entirely over the resulting structure so as to implant high density impurity ions in the pad polysilicon film; etching the pad polysilicon film to remove all pad polysilicon film but pad polysilicon film atop the operational region; and applying a thermal process to form the N+/P+ source/drain region within the low density ion-implanted region.

The above and other objects and advantages of the present invention will become more apparent as the following description proceeds.

To the accomplishment of the foregoing and related ends, the invention, then, comprises the features hereinafter fully described in the specification and particularly pointed out in claims, the following description and the annexed drawing setting forth in detail a certain illustrative embodiment of the invention, this being indicative, however, of but one of the various ways in which the principles of the invention may be employed.

DETAILED DESCRIPTION OF THE PREFERRED EMBODIMENTS

Figure 1:
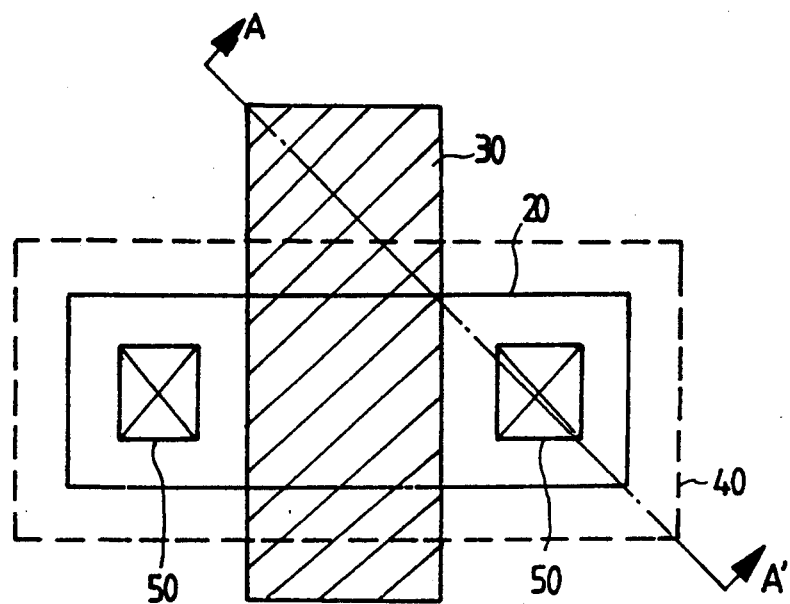
FIG. 1 is a schematic plan view showing only mask layers necessary to fabricate an LDD MOSFET according to a conventional method.

Hereinafter, the preferred embodiments of the present invention will be in detail described with reference to several figures, wherein like reference numerals designate like parts, respectively.

Figure 3:
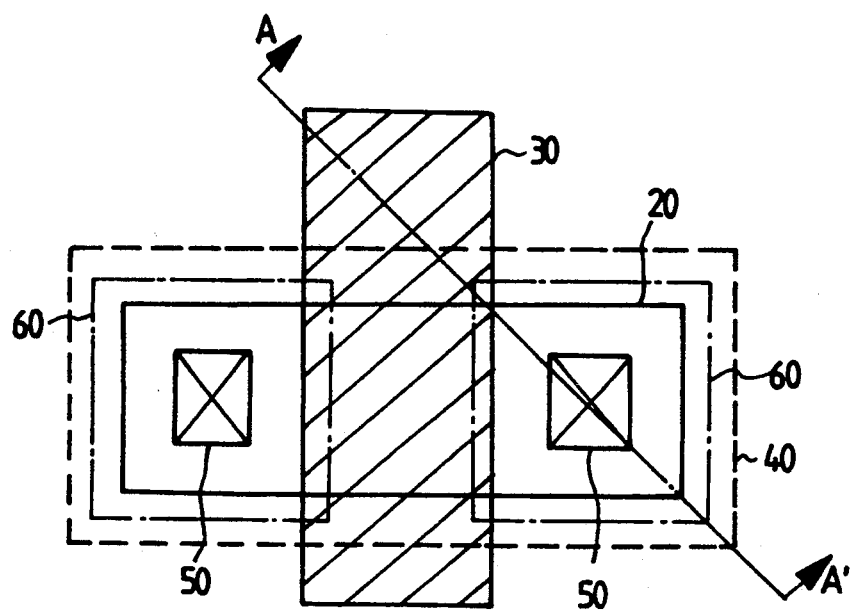
FIG. 3 is a schematic plan view showing only mask layers necessary to fabricate an LDD transistor according to the present invention.

First, referring to FIG. 3, there is a plan view showing only mask layers necessary to fabricate a transistor according to the present invention. This figure is similar to FIG. 1, except that, in advance of forming the high density N+/P+ source/drain region, a pad poly mask 60 is used for forming a pad polysilicon film which plays an important role in improving the electrical characteristics of the inventive transistor.

Figure 4:
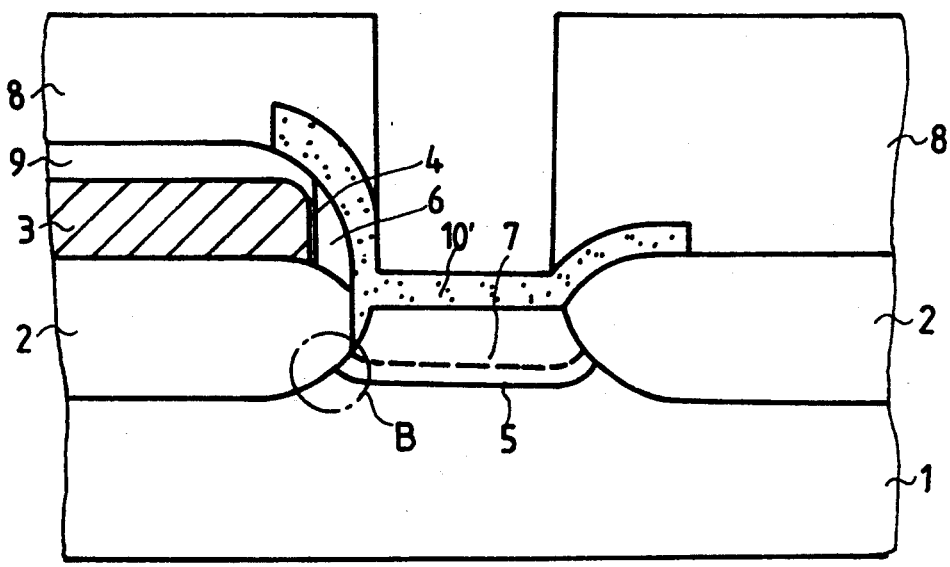
FIG. 4 is a schematic, cross-sectional view showing the transistor fabricated according to the present invention, taken generally through section line A—A' of FIG. 3.

Referring now to FIG. 4, there is a schematic, cross-sectional view showing the transistor fabricated by the method according to the present invention, taken generally through section line A—A' of FIG. 3. As shown in FIG. 4, the transistor according to the present invention essentially comprises a semiconductor substrate 1 sectioned by a field oxide film 2 which is partially removed at bird's beak, a gate electrode 3 insulated by a gate polyoxide film 4 and an insulating film 9 at its side wall and upper surface, respectively, a low density ion-implanted region 5 formed in an operational region of the semiconductor substrate 1, a spacer oxide film 6 formed at the side wall provided by the gate polyoxide film 4 and the insulating film 9, a pad polysilicon film 10' covering the insulating oxide film 9, the gate side wall spacer oxide film 6' and the low density ion-implanted region 5, simultaneously, and a high density ion-implanted region 7 confined within the low density ion-implanted region below the pad polysilicon film 10', the high density ion-implanted region 7 being formed at the portion intersected by the gate electrode 3, the field oxide film 2 and the low density ion-implanted region 5 which the intersectional portion is the thickness of the pad polysilicon film 10' distant from the bird's beak damaged when an etch process is carried out to form the gate side wall spacer 6'.

The method for accomplishing the inventive structure is to be described next, referring to FIGS. 5A through 5D, which are schematic cross sectional views illustrating a method for fabricating the transistor according to the present invention, taken generally through section line A—A' line of FIG. 3.

Figure 5A:
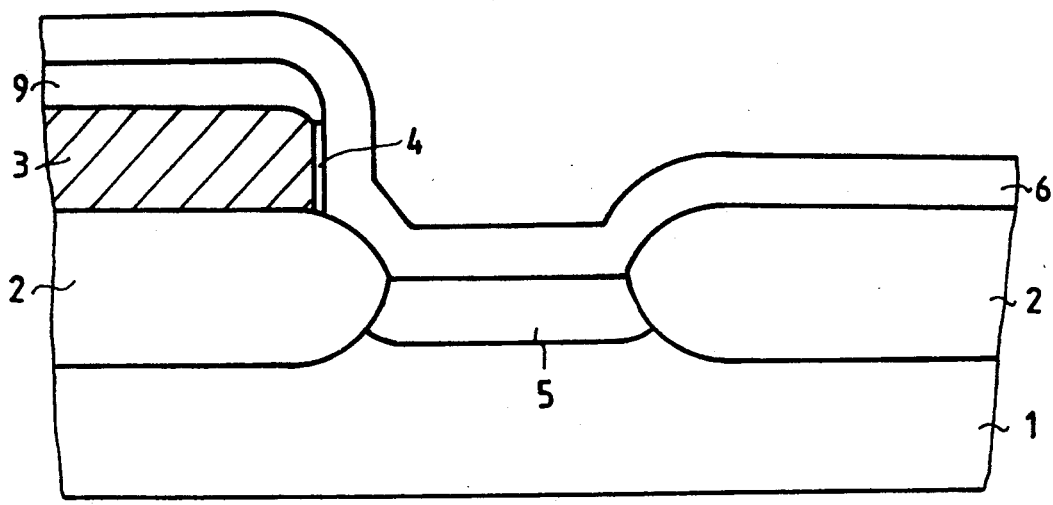
FIGS. 5A through 5D are schematic, cross-sectional views illustrating the inventive method for fabricating the LDD transistor, taken generally through section line A—A' of FIG. 3, respectively.

First, as shown in FIG. 5A, a silicon substrate 1 having a P-well (or an N-well) is sectioned into a device separation region and an operational region by the formation of a field oxide film 2 having bird's beak. Over the silicon substrate are entirely deposited a gate polysilicon film and an insulating oxide film in a predetermined thicknesses, in due order, which are then, subjected to an etch process using a gate electrode mask so as to form a gate electrode 3 covered with the insulating film 9 on the field oxide film 2. The exposed side wall of the gate electrode is oxidized to form a gate polyoxide film 4. Impurities having an ion density of approximately $1 \times 10^{17}$ to $1 \times 10^{19}$ atoms/cm$^3$ are implanted in the operational region of the silicon substrate to form an LDD region and then, a gate side wall oxide film 6 is entirely deposited over the resulting structure at a predetermined thickness.

Figure 5B:
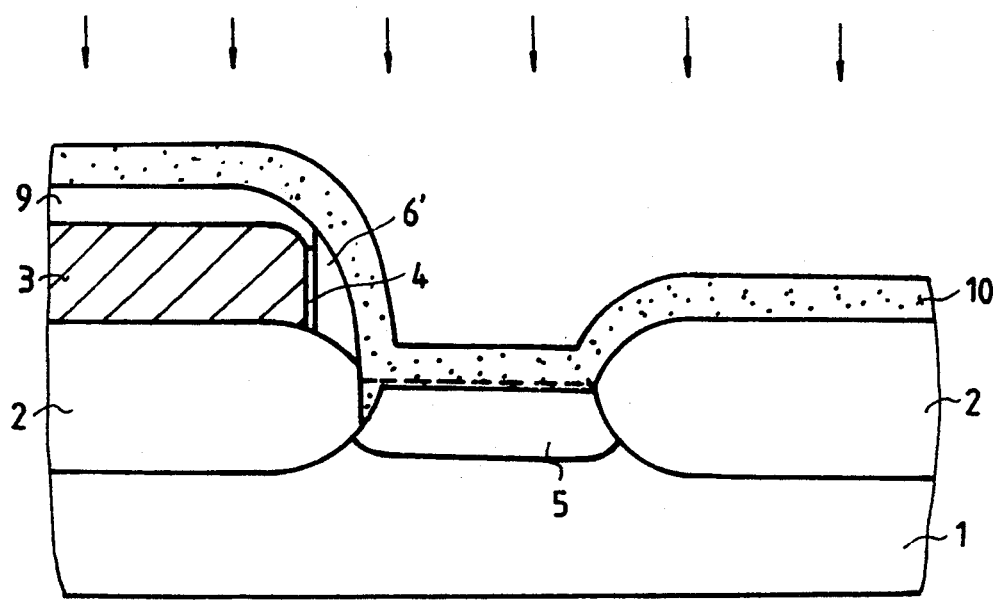

Next, the gate side wall oxide film 6 is subjected to an anisotropic etch process to form a gate side wall spacer 6' and over the resulting structure is entirely formed a pad polysilicon film with a predetermined thickness, as shown in FIG. 5B. This figure also shows that ion impurities having an ion density of not less than $1 \times 10^{20}$ atoms/cm$^3$ is subsequently implanted, as indicated by arrows, in the pad polysilicon film 10 atop the operational region.

Figure 5C:
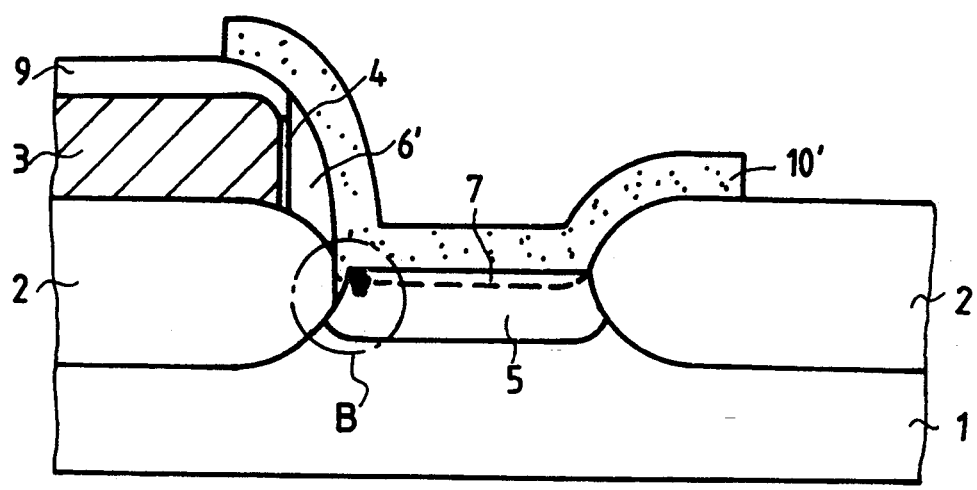
Figure 5D:
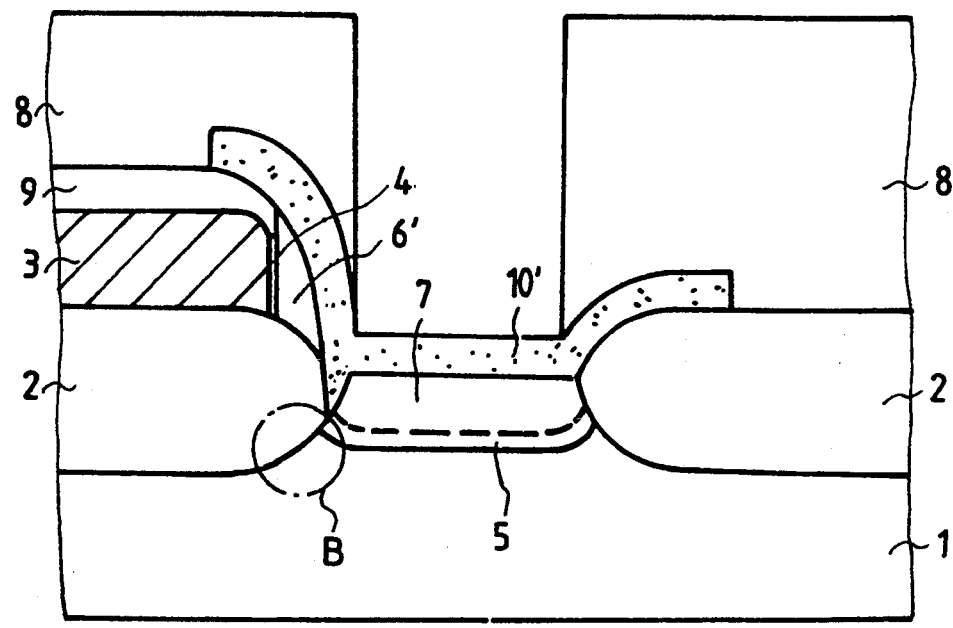

The pad polysilicon film 10 is etched by use of the pad polysilicon film mask, leaving another pad polysilicon film 10' atop the operational region and the spacer oxide film 6' and then, subjected to a thermal treatment process to form an N+/P+ source/drain region, that is, a high density ion-implanted region 7, as shown in FIG. 5C. The reference mark B of FIG. 5C shows an improved source/drain junction, as compared with the conventional one. That is, the operational region formed by the conventional method for fabricating an LDD MOSFET is damaged by high density N+/P+ ion-implantation when etching the gate side wall spacer. On the other hand, in accordance with the present invention, using the gate side wall spacer 6' formed smaller than the conventional one and the pad polysilicon film 10' as a new gate side wall spacer, the gate side wall pad polysilicon film 10' serves as a mask when high density impurities are ion-implanted to form the N+/P+ source/drain region. Therefore, the high density ions are implanted in the region which is the thickness of the pad polysilicon film 10' distant from the portion damaged by etching the gate spacer oxide film 6', so that the source/drain junction is remarkably improved in contrast with the conventional one.

Figure 2A:
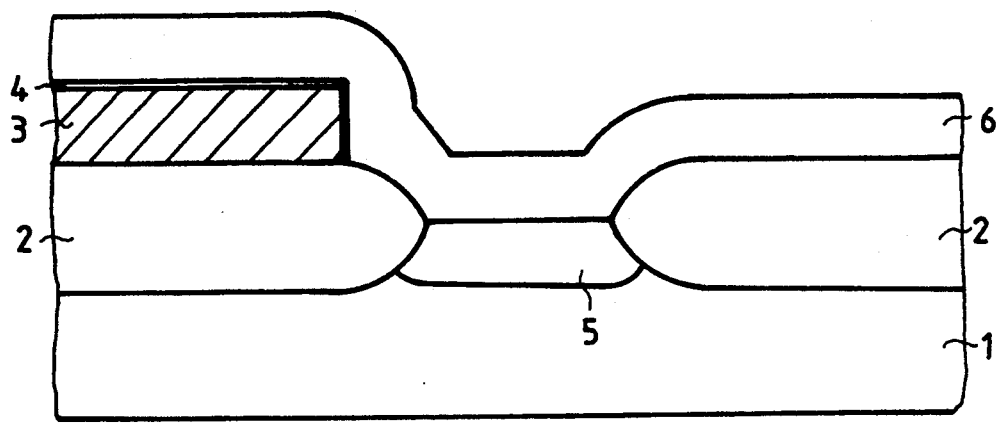
FIGS. 2A through 2D are a schematic, cross-sectional views illustrating the conventional method for fabricating the LDD MOSFET, taken generally through section line A—A' of FIG. 1, respectively.
Figure 2B:
Figure 2B:
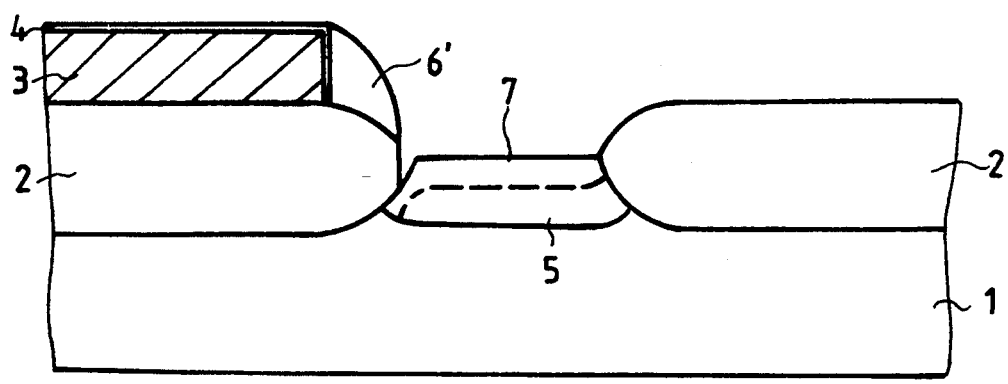
Figure 2C:
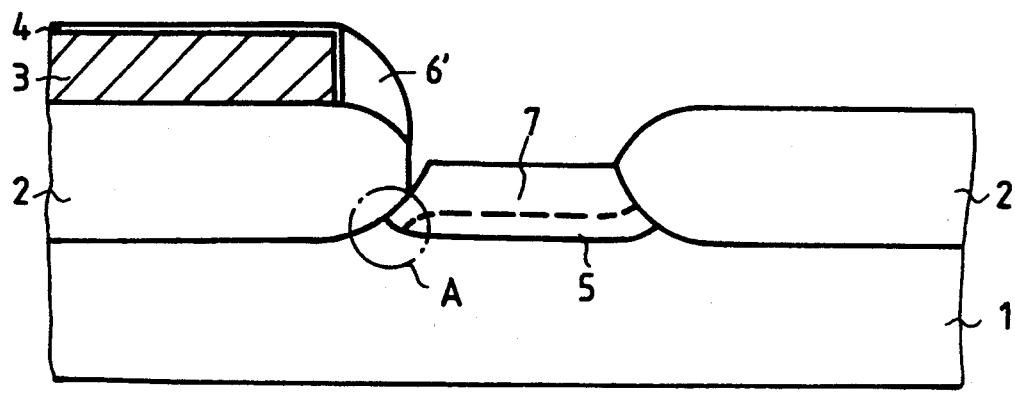
Figure 2D:
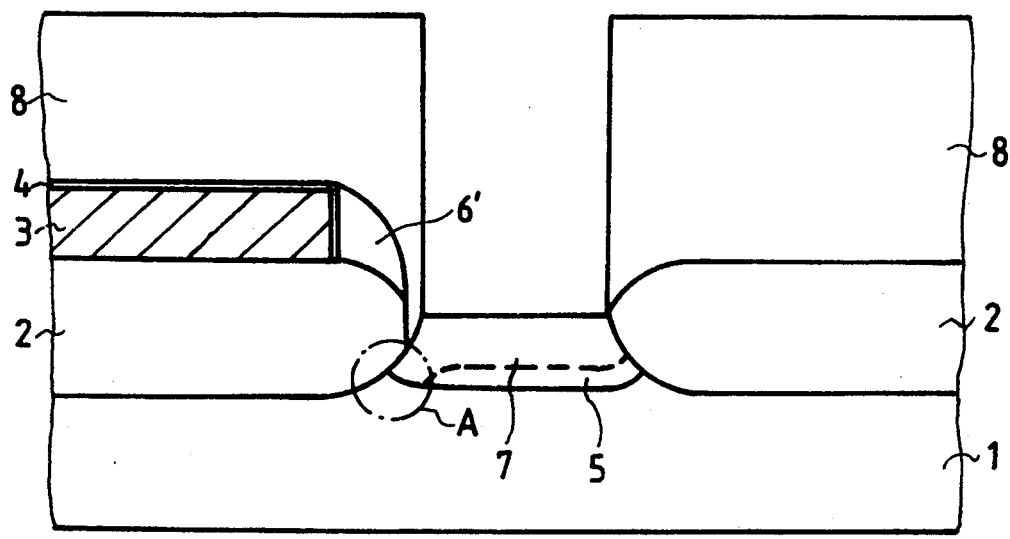

Finally, an interlayer insulating film 8 is formed and then, subjected to an etch process to form a contact hole, leaving the high density ion-implanted region to exist in the LDD region, as shown in FIG. 2D.

The pad polysilicon film 10' plays a role in protecting the operational region when forming the contact, so that fabrication process margin can be obtained.

As illuminated hereinbefore, the high density diffusing region is confined within the low density operational region formed in the semiconductor substrate, preventing the weakening of the source/drain junction breakage voltage and the increase of the junction leakage current, in accordance with the present invention. In addition, the method according to the present invention can secure a margin in the fabrication process, whereby a reliable transistor can be fabricated.

What is claimed is:

1. In a method for fabricating a transistor wherein a semiconductor substrate is sectioned into an operational region and a device separation region by the formation of a field oxide with a bird's beak and has in said operational region a low density ion-implanted region which a high density ion-implanted region is confined within, so as not to contact said high density ion-implanted region with said semiconductor substrate when forming a source or drain region, the improvement which comprises the steps of:

forming a gate electrode on said field oxide film said gate electrode being insulated by an insulating film formed thereon and a gate polyoxide film resulting from the oxidation of its side wall;

forming a spacer insulating film at the side wall provided by said insulating film and said gate polyoxide film;

depositing a pad polysilicon film entirely over the resulting structure so as to implant high density impurity ions in said pad polysilicon film;

etching said pad polysilicon film so as to leave said pad polysilicon film atop said operational region and said spacer insulating film; and applying a thermal process to form one of said source region and said drain region within said low density ion-implanted region.

2. A method according to claim 1, further comprising the steps of:

forming an interlayer insulating film over said pad polysilicon film; and etching said pad polysilicon film to form a contact hole, through which said high density ion-implanted region formed in said low density ion-implanted region can be electrically connected.

3. A method according to claim 1, wherein said low density ion-implanted region has an impurity ion concentration of approximately $1 \times 10^{17}$ to $1 \times 10^{19}$ atoms/cm$^3$.

4. A method according to claim 1, wherein said high density ion-implanted region has an impurity ion concentration of not less than approximately $1 \times 10^{20}$ atoms/cm$^3$.

* * * * *